METHOD OF PRODUCING SEMICONDUCTOR CRYSTAL BODIES
Filed June 21, 1955
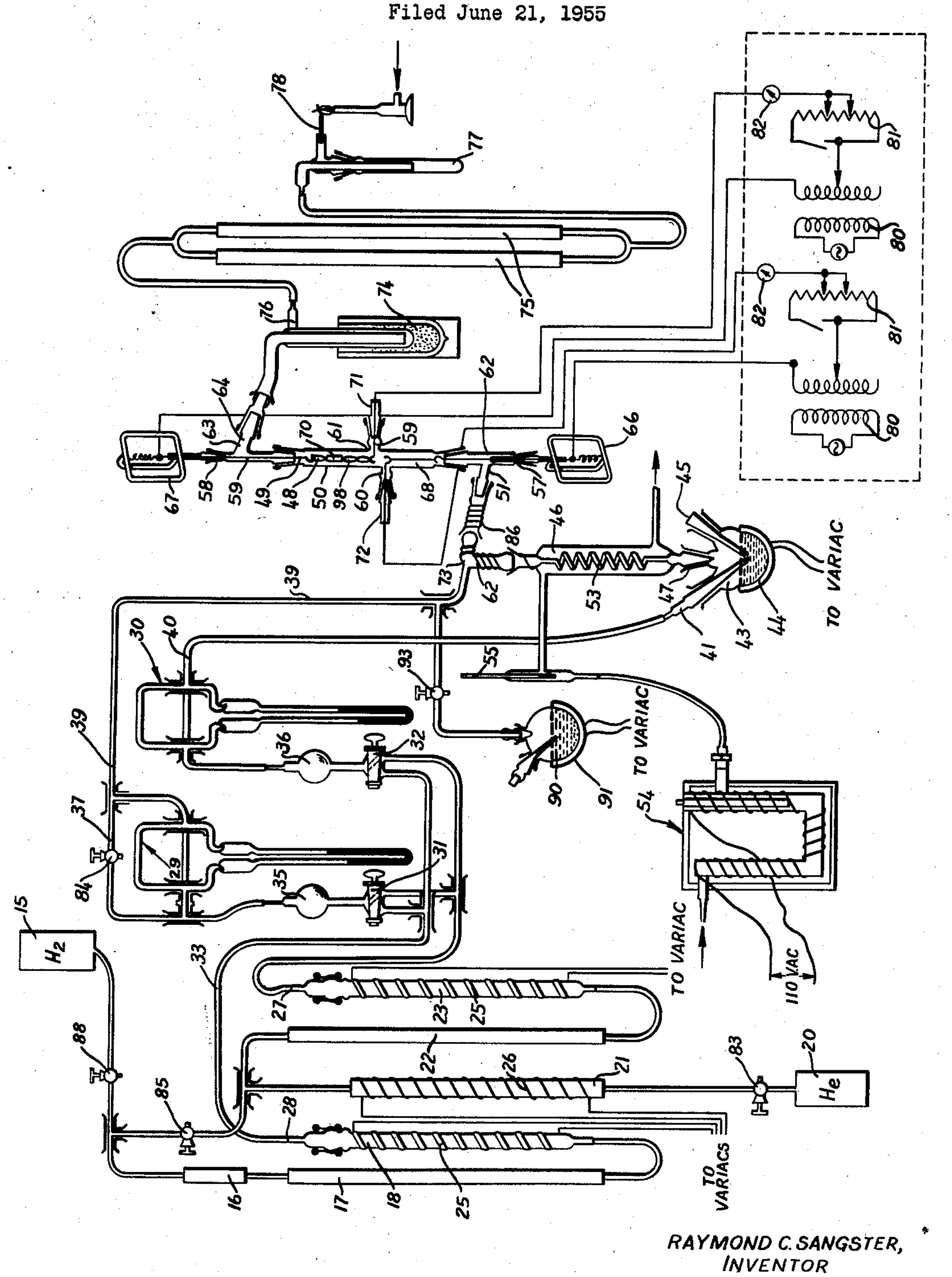
RAYMOND C. SANGSTER,
INVENTOR
BY Henry Heyman
ATTORNEY United States Patent Office 2,895,858

Patented July 21, 1959

2,895,858

METHOD OF PRODUCING SEMICONDUCTOR CRYSTAL BODIES

Raymond C. Sangster, Dallas, Tex., assignor to Hughes Aircraft Company, Culver City, Calif., a corporation of Delaware Application June 21, 1955, Serial No. 516,897

7 Claims. (Cl. 148—1.5)

The present invention relates to semiconductor devices and, more particularly, to an improved method of producing semiconductor crystal bodies.

In the semiconductor art, a region of semiconductor material containing an excess of donor impurities and having an excess of free electrons is considered to be an N-type region, while a P-type region is one containing an excess of acceptor impurities resulting in a deficit of electrons or, stated differently, an excess of holes. When a continuous solid specimen of semiconductor material has an N-type region adjacent a P-type region, the boundary between the two regions is termed a P-N (or N-P) junction and the specimen of semiconductor material is termed a P-N junction semiconductor device. Such a P-N junction device may be used as a rectifier. A specimen of semiconductor material having two N-type regions separated by a P-type region, for example, is termed an N-P-N junction semiconductor device or transistor, while a specimen having two P-type regions separated by an N-type region is termed a P-N-P junction semiconductor device or transistor.

The term, "monatomic semiconductor material," as utilized herein, is considered generic to both germanium and silicon, and is employed to distinguish these semiconductors from metallic oxide semiconductors such as copper oxide and other semiconductors consisting essentially of chemical compounds.

The term, "active impurity," is used to denote those impurities which affect the electrical rectification characteristic of monatomic semiconductor material, as distinguishable from other impurities which have no appreciable effect upon these characteristics. Active impurities are ordinarily classified either as donor impurities—such as phosphorus, arsenic, and antimony—or as acceptor impurities, such as boron, aluminum, gallium, and indium.

The advantages of junction type semiconductor devices over more conventional point contact semiconductor devices are now well known to those skilled in the art. Furthermore, the physical advantages of silicon over germanium in certain types of semiconductor applications are also well known. However, the production of junction type silicon semiconductor devices has been difficult owing to the fact that the production techniques which have been found suitable for producing germanium junction type semiconductor devices are not readily adapted to the production of silicon junction type semiconductor devices. In addition, the inherent tendency of silicon toward rapid formation of an extremely hard and stable oxide has rendered it difficult to create junction type silicon semiconductor devices because of the difficulty encountered in introducing an active impurity into the surface of silicon crystals.

Two of the primarily important properties that must be possessed by crystals to be used for successful semiconductor devices are high purity and a high degree of crystalline perfection. Silicon, however, is difficult to produce in pure form and difficult to handle and keep pure while in the liquid state. For example, in the use of silicon for semiconductor devices, upon melting the silicon a certain amount of uncontrollable contaminants and impurities are introduced from the crucible in which the liquid silicon is contained. These contaminants are detrimental to the electrical characteristics of the semiconductor crystal bodies which are produced. Thus, although silicon obtained by metallurgical methods should have a purity close to 100 percent, the strong affinity which silicon in its elemental state has for other elements makes the exclusion of undesirable impurities in varying and uncontrolled amounts very difficult.

Accordingly, it is an object of the present invention to provide an improved method of forming silicon crystals of high purity and a high degree of crystalline perfection.

It is another object of the present invention to provide a method of forming monatomic semiconductor crystal bodies which obviates the necessity of handling the semiconductor material as a liquid.

It is another object of the present invention to provide a method of forming semiconductor crystal bodies having one or more P-N junction regions therein.

It is a further object of the present invention to provide a method of forming silicon crystal bodies in which active impurities may be controlled and uniformly distributed.

It is a further object of the present invention to provide a method of forming impurity doped regions in a silicon crystal which is efficient and lends itself to mass production.

It is a further object of the present invention to provide a method of forming semiconductor crystal bodies having optimum electrical characteristics.

It is a still further object of the present invention to provide a method of producing broad area P-N junctions which is accurately controllable.

It is a still further object of the present invention to provide a method of producing broad-area P-N junctions within a silicon crystal which may be later divided to produce a plurality of rectifying crystals for semiconductor devices.

Still another object of the present invention is to provide a method of producing broad-area P-N junctions in silicon crystals which are capable of carrying large currents.

The method of the present invention comprises the steps of forming a vapor of hydrogen and a halide compound of silicon, heating a silicon seed crystal which has been crystallographically oriented to a predetermined temperature in a reaction chamber and passing the vapor through the reaction chamber where the vapor is thermally decomposed and elemental silicon is deposited on the seed crystal to form a single crystal silicon body of high purity and high crystalline perfection. In addition, an active impurity may be added to the vapor of hydrogen and silicon halide to create P-type or N-type semiconductor regions in the crystal.

The novel features which are believed to be characteristic of the invention, both as to its organization and method of operation, together with further objects and advantages thereof, will be better understood from the following description considered in connection with the accompanying drawing, in which a presently preferred embodiment of the apparatus utilized in carrying out the method of the present invention is illustrated by way of example. It is to be expressly understood, however, that the drawing is for the purpose of illustration and description only and is not intended as a definition of the limits of the invention.

The single figure illustrates a presently preferred embodiment of the apparatus used to carry out the method of the present invention to deposit silicon upon a silicon seed crystal.

Referring now to the drawing, there is shown one form of apparatus for carrying out the method of the present invention to deposit silicon in properly oriented growth upon a heated silicon seed crystal to obtain a single crystal by causing the endothermic reaction of silicon tetrabromide with hydrogen to yield elemental silicon and hydrogen bromide. The elemental silicon is deposited on the silicon seed crystal in an oriented growth to form a silicon single crystal having the desired diamond lattice structure and crystalline perfection. Although the method of the present invention will be described with some particularity with reference to the growth of a silicon single crystal from the thermal decomposition of silicon tetrabromide, it is to be understood that the other halide compounds of silicon, namely, silicon tetrachloride, silicon tetraiodide, and silicon tetrafluoride, may also be used. In the presently preferred embodiment of the present invention, silicon tetrabromide is used as the source of elemental silicon in preference to the other silicon halides due to the combination of physical and chemical properties which make it susceptible to high purification and the production of very high purity silicon. The boiling point of silicon tetrabromide, which is of the order of 150° C., and the melting point of silicon tetrabromide, which is of the order of 5.2° C., are both convenient for phase change purification processes and the liquid temperature range is excellent for convenient handling of the material. The purity of the silicon tetrabromide which is used affects to a high degree the crystallographic perfection of the deposit which is produced upon the silicon seed crystal. One of the mechanisms by which the unwanted impurities produce undesired results appears to be by favoring disoriented crystal growth so that such growth predominates over the desired oriented growth.

For these and other reasons, silicon tetrabromide of requisite purity is produced, prior to use in the deposition method, by the reaction of bromine with incandescent silicon using reagent grade bromine and 99.95% silicon as the starting materials. This reaction yields silicon tetrabromide having significant impurities present in concentrations of the order of one part in ten million or more. Sufficiently pure silicon tetrabromide for use in the method of the present invention may be produced by various methods well known to the art and forms no part of the present invention. Therefore, although silicon tetrabromide may be produced by the process described hereinbefore, the process will be described in no further detail and the apparatus for the production of silicon tetrabromide is not shown.

The apparatus shown in the figure consists of four main subassemblies which are the gas purification and flow control train, the decomposition assembly proper, the effluent gas disposal system, and the filament power supply.

The gas purification and control train comprises a source of hydrogen 15 which is connected in series to a de-oxidizing palladium catalyst unit 16 of the type well known to the art, a Dehydrite drying tube 17, and a calcium hydride tube 18, which dry the hydrogen and remove any free oxygen which may be present in the hydrogen gas. If nitrogen is present in the hydrogen in any appreciable quantities, it should be removed, since nitrogen will react with the hot silicon produced in the reaction chamber as described hereinafter. For example, although not shown in the figure, the use of titanium and zirconium at 850° C. in the hydrogen purification train will eliminate any nitrogen present.

In the apparatus shown, the various units are interconnected by Tygon tubing and Pyrex glass is used throughout the apparatus with the exception of the reaction chamber 50 which may be made of high silicon glass such as Vycor glass. Cello grease is used on all ground glass joints.

A source of helium 20 is connected in series to a hot copper furnace 21, a Dehydrite drying tube 22, and a calcium hydride tube 23 which successively remove the oxygen, remove the water, and then remove remaining traces of water and oxygen. The calcium hyride tubes 18, 23 are wrapped with heating tapes 25 which are in turn connected to a Variac as indicated. The hot copper furnace 21 is wrapped with a heating wire 26 which is in turn also connected to a Variac as indicated. The outlets 28, 27 from the calcium hydride tubes 18, 23 are connected in parallel through a first and second 2-way valve 31, 32 in series with a first and second pressure equalizing bulb 35, 36 to a first and second calibrated mercury-manometer-differential-pressure flowmeter 29, 30. A bypass 37 on the first tube flowmeter 29 is provided for flushing operation. A first gas outlet 39 is connected from the first flowmeter 29 to a reaction chamber as described hereinafter. A second purified gas outlet 40 is connected to the silicon tetrabromide container as described hereinafter.

The gas outlet 40 from the second tube flowmeter 30 is connected to a gas inlet pipe 41 of the silicon tetrabromide pot 43 which contains the silicon tetrabromide in a liquid from. In the presently preferred embodiment, a 200 ml. Pyrex container is used. The silicon tetrabromide pot is positioned upon an electrically controlled heating mantle 44 which is connected to a Variac as indicated for varying the temperature of the silicon tetrabromide. The gas inlet pipe extends into the liquid silicon tetrabromide, in order that gas may be bubbled through the liquid to produce a highly saturated silicon tetrabromide-hydrogen mixture. A thermometer 45 extending into the liquid silicon tetrabromide indicates the temperature of the liquid.

A water cooled stripping condenser 46 is directly connected to the vapor outlet 47 of the silicon tetrabromide pot 43 to control the concentration of the silicon tetrabromide-hydrogen mixture which emerges from the silicon tetrabromide pot into a reaction chamber 50 through the vapor inlet pipe 51 of the reaction chamber. The concentration of the vapor leaving the pot is controlled by means of circulating water in the stripping condenser 46 flowing around the vapor line 53 passing through the stripping condenser. The temperature of the circulating water is controlled by means of an electric water heater 54 placed between the source of water and the water inlet of the stripping condenser 46. A thermometer 55 in the circulating water line indicates the temperature of the circulating water passing into the stripping condenser.

The gas outlet 39 from the first tube flowmeter 29 is also connected to the vapor inlet pipe of the reaction chamber 50 between the vapor outlet from the stripping condenser 46 and the vapor inlet 51 of the reaction chamber. Thus, purified hydrogen may be added to the silicon tetrabromide-hydrogen mixture leaving the stripping condenser 46 to dilute the vapor if necessary and control the concentration of silicon tetrabromide in the vapor entering the reaction chamber 50.

The reaction chamber 50 is a Vycor tube approximately 35 centimeters in length, having an inside diameter of the order of 25 millimeters. The reaction tube has open end ground glass joints 57, 58 and ground glass openings 60, 61 which are positioned approximately at the mid point of the length of the reaction chamber. A first and second T outlet 62, 63 is provided near the open ends 57, 58 of the Vycor tube 50 which forms the reaction chamber. The first T connection 62 forms the vapor inlet 51 to the reaction chamber and the second T outlet 63 forms the vapor outlet 64 at the opposite end of the reaction chamber. Glass rod racks 66, 67 are fitted at the T openings at opposed ends of the reaction chamber for mounting a tantalum filament 68 and silicon seed filament 70 within the reaction chamber 50, as will be described hereinafter. The first and second mid point openings 60, 61 in the reaction chamber accommodate the insertion of power connections 71, 72 to the filaments 68, 70, as described hereinafter. A Dry Ice cold bath 74 is connected to the vapor outlet 64 of the reaction chamber 50 to freeze out any unreacted silicon tetrabromide passing from the reaction chamber. In the presently preferred embodiment a Dry Ice bath of solid carbon dioxide and trichloroethylene is used. Acid absorption tubes 75 are connected in parallel to the vapor outlet 76 from the Dry Ice bath to absorb remaining hydrogen bromide and silicon tetrabromide. In the presently preferred embodiment, the acid absorption tubes 75 are filled with indicating soda-lime. A final water trap 77 is connected to the outlet of the acid absorption tube and a nozzle 78 for exhausting hydrogen over an open flame is provided at the outlet of the water trap to burn and dispose of remaining hydrogen.

The filament power supply in the presently preferred embodiment comprises a 20-ampere Variac 80, a rheostat 81 and an ammeter 82.

Referring again to the figure, a seed crystal of silicon which is used as the filament upon which the monatomic semiconductor material is to be deposited is prepared for placement in the apparatus. In the presently preferred embodiment of this invention, a silicon seed crystal having finished dimensions of approximately 1 inch in length and .03 by .10 inch in rectangular cross-section is used. After cutting the seed filament from a larger crystal, the sawed filament is lapped down at least two or three mils to remove the damage caused by the diamond saw. The filament is then etched to remove another two or three mils of silicon off of each surface to remove the lapping damage. After the lapping and etching have been completed and the desired dimensions have been attained, electrical leads are mounted by notching the ends of the silicon seed crystal and wrapping 5 or 10 mil tantalum wire tightly about the ends. Two or three loops of 10 mil tantalum wire are formed which will pull up tight against the bundle formed by the wrapping process and which extend beyond the ends of the filament. The lead wires are then coated with a protective layer, which is preferably an easily volatilized substance, and the filament seed assembly is given a final brief etching, either in a fast etch of a 1 to 1 mixture of hydrofluoric and nitric acid, or a slow etch in a mixture of equal parts of hydrofluoric acid, nitric acid, and acetic acid. The major portion of the protective layer is then removed by a stream of suitable organic solvent and the filament is mounted in the reaction chamber. The silicon seed filament is mounted in the reaction chamber by connecting stranded loops of 20 mil tantalum wire 48 in electrical contact with the loops of tungsten wire which are affixed to the seed crystal. The loops of nickel wire 48, in turn, are connected to and make electrical contact with hooks 49 formed on the ends of the power leads. The upper and lower power leads 59 are 0.05 inch tungsten rods sliding in Pyrex capillaries. A sealant, such as "Tackiwax," is used to seal the gaps between the leads and the capillaries. The central leads are copper, tungsten, and nickel assemblies sealed through the Pyrex ground glass joints.

A tantalum filament 68 is mounted in the reaction chamber beneath the silicon seed filament. In the presently preferred embodiment, a 100 mm. length of tantalum wire is used as the tantalum filament. Tantalum was adopted in preference to other metals such as molybdenum and tungsten which will also yield satisfactory results. The tantalum filament before mounting in the reaction chamber is cleaned and prepared for use by anodic oxidation in a 10% solution of sodium hydroxide, followed by rinsing with water, acetone, and trichloroethylene. The tantalum filament is then mounted in the reaction chamber by means of the system illustrated in the figure, in which a 0.05 inch tungsten rod bent into a hook at one end slides through a close fitting capillary which is sealed to a ground glass joint. The arrangement at the inner end of the joint prevents silicon tetrabromide, which may condense in the adapter, from running down into the capillary. "Tackiwax," reinforced if necessary by a coating of collodion, is used to seal the opening between the lead and the capillary. A rack of glass rod fused onto the capillary provides an anchor for a spring which is clamped onto the tungsten lead to keep the filament taut. The clamp serves as a convenient place to attach a clip lead from the power supply. In the filament arrangement shown, both top and bottom lead systems are the same.

Before discussing the deposition operation of the apparatus shown, it should be noted that although the heating of the auxiliary tantalum filament is straightforward, control of the silicon seed filament temperature is more complex, due to the negative resistance characteristics of intrinsic silicon over much of its temperature range. Without an adequate stabilizing load resistance, the current in the silicon filament will rise very rapidly to a value which is sufficient to melt the filament when the necessary critical voltage or current is reached and the conductivity goes over from extrinsic to intrinsic.

The following procedure of temperature control of the silicon seed filament has been found to give satisfactory results. The rheostat controlling the silicon filament is set for its maximum resistance. The voltage across the rheostat and filament is increased until the filament begins to conduct appreciably and to glow a dull red. Once the filament begins to glow, the rheostat resistance and Variac voltage are reduced alternately, and the rheostat is changed by closing the rheostat switch to its low resistance form until the desired filament temperature is obtained with no unnecessary loss of power in the rheostat and with the Variac voltage in a convenient range. Variac settings of the order of 50 volts and load (rheostat) resistance of about 1 ohm have been found to be most useful for the filaments and temperatures which are used. The basic concept in this control process is to start with a load resistance which is large compared to the intrinsic resistance of the silicon filament at the normal operating temperatures, but is small compared to the extrinsic resistance at room temperatures, and then to switch over to a load resistance approximately comparable to the extrinsic resistance of the silicon filament once the operating temperature has been reached.

The sequential operation of the apparatus to carry out the process of the present invention will now be described in some detail in connection with the production of highly purified silicon crystals having properly oriented lattice structure which may be used as the crystal in semiconductor devices.

In operating the apparatus shown in the figure, the filaments 68, 70 are positioned in the reaction chamber 50 as described hereinbefore and all connections are sealed. The heating wire 26 and heating tapes 25 are energized and the calcium hydride tubes 18, 24 and the hot copper furnace 21 are brought up to the desired temperature, for example 250° C. The valve 83 to the helium source 20 and the bypass valve 84 are opened, and the flow valve 31 is positioned to pass helium from the purified helium line into the first pressure equalizing bulb 35. The flow train valve 85 is also opened in order to flush the complete gas purification train together with the reaction chamber and gas disposal section. In flushing the apparatus with helium, the helium itself is dried and purified by passing over the hot copper in the hot copper furnace 21 to remove any oxygen present and through the Dehydrite tubes 17, 22 to remove any water which may be present. While flushing the apparatus for several minutes, the heating mantle 44 is energized, the silicon tetrabromide in the pot 43 is brought up to the refluxing temperature of 150° C. and the heating wire 86 on the reaction chamber T inlet 78 is turned on. The water heater 54 is energized from the 110 volt alternating current line and the stripping condenser 46 is brought up to temperature by raising the temperature of the water. In this embodiment, a circulating water temperature of the order of 80° C. is used.

During the flushing operation, the relative gas flow rates into the pot 43 and reaction chamber 50 are adjusted. The calibrated mercury-manometer differential-pressure flowmeters 29, 30 are used to measure both gas flow rates. For rapid flushing, the bypass 37 on the tube flow meter 29 is used. Helium flow is used in a separate operation to calibrate the capillaries for absolute flow rate to a ±1 percent precision and the values for hydrogen are computed by use of known viscosity data. The concentration of silicon tetrabromide vapor entering the reaction chamber 50 is in like manner calibrated by using helium as a carrier. During operation of the apparatus, the hydrogen flow rates into the inlet pipe 41 to the silicon tetrabromide pot 43 and reaction chamber inlet pipe 51 are then determined by measuring the pressure drops across the capillary tubes of the flow meters 29, 30.

After flushing and adjusting the apparatus, but before beginning the deposition run, the silicon filament is pre-heated in a stream of pure hydrogen for 30–60 minutes. In this embodiment a pre-heating temperature of the silicon filament of 1275° C. is used. During pre-heating, the helium valve 83 and flow train valve 85 are closed and the hydrogen source valve 88 is opened. The heating tape 25 on the calcium hydride tube 18 is energized and the flow valve 31 to the first flow meter 29 is positioned to admit hydrogen from the purified hydrogen line 33 to the first pressure equalizing bulb 35. The hydrogen then flows from the source to the de-oxidizing unit 16, through the Dehydrite drying tube 17 and calcium hydride tube 18, through the first flow meter 29 and into the reaction chamber 50 through the reaction chamber inlet pipe 51. The dried and purified hydrogen then flows through the reaction chamber, past the tantalum filament 68, the silicon seed filament 70, and from the reaction chamber through the outlet 64.

The silicon seed filament is raised to the pre-heating temperature of 1275° C. as described hereinbefore. The silicon filament is maintained at this temperature and pre-heated 30–60 minutes in the atmosphere of hydrogen. After pre-heating the heating power to the silicon filament is turned off, and the deposition operation, as described hereinafter, is begun.

For the deposition run, the water heater 54 is turned on and the circulating water is raised to the temperature required in the stripping condenser 46, which is of the order of 80° C. The heating mantle 44 is energized and controlled to raise the silicon tetrabromide in the pot 43 to the refluxing temperature of 150° C. as indicated by the thermometer 45. The heating tape 86 on the reaction chamber T inlet 62 is energized and adjusted to a temperature of the order of 100° C. The circulating water temperature and the temperature maintained at the T inlet 62 is dependent upon the concentration at which it is desired to maintain the silicon tetrabromide vapor entering the reaction chamber 50. In the described embodiment with a vapor concentration of about 1 percent, the foregoing temperatures are used. The hydrogen flowing through the reaction chamber during the pre-heating operation has continued to flow to maintain the hydrogen atmosphere in the reaction chamber. Thus, the hydrogen source valve 88 is open and the flow valve 31 to the first flow meter 29 is in the position to admit hydrogen to the first pressure equalizing bulb 35. To admit hydrogen to the silicon tetrabromide pot 43, flow valve 32 to the second flow meter 30 is positioned to admit hydrogen from the purified hydrogen line 33 to the second equalizing bulb 36. The hydrogen then flows into the silicon tetrabromide pot 43 through the inlet pipe 41 which admits the hydrogen below the liquid level of the silicon tetrabromide. Hydrogen is also flowing into the T-inlet 62 of the reaction chamber 50 as described hereinbefore.

Thus, hydrogen is bubbled through the silicon tetrabromide in the pot 43 to produce a gas mixture which is then stripped down to a known silicon tetrabromide concentration in the stripping condenser. Additional hydrogen is added above the condenser 46 to produce the desired reaction mixture entering the reaction chamber 50, which in this embodiment is of the order of 0.7 mole percent. Although a concentration of 0.7 mole percent is described, satisfactory results have been obtained with a concentration of the reaction mixture in the range of the order of 0.6 to 1.0 mole percent. A hydrogen flow rate of the order of 1.5 liters/minute is used for optimum results, although satisfactory results have been achieved with hydrogen flow rates in the range of 1 to 3 liters/minute.

After the hydrogen flow rates and the concentration of the silicon tetrabromide-hydrogen mixture passing through the reaction chamber have been adjusted and stabilized, the tantalum filament 68 is raised to a temperature of the order of 1100° C. by means of the Variac 80, rheostat 81, and ammeter 82. The silicon seed filament 70 is then energized and raised to the deposition temperature of 1150° C. in this embodiment in the manner described hereinbefore. A temperature range of the silicon seed filament of the order of 1100° C. to 1350° C. yields satisfactory results.

The hot tantalum filament 68 positioned in the reaction chamber 50 ahead of the silicon seed filament 70 in the flow stream serves only to effect a final purification of the reacting gases by catching the small amount of impure deposit that always seems to form where deposition begins. The silicon tetrabromide-hydrogen mixture flowing past the hot seed filament 70 decomposes at the hot surface of the hot silicon filament to form silicon and hydrogen bromide. Since the reaction is endothermic, the decomposition at a hot surface tends to be self-regulating and uniform over the surface. The liberated silicon is deposited evenly upon the surface of the silicon filament 70 where it grows in the desired crystal lattice structure. The hydrogen bromide then passes out of the reaction chamber 50 through the outlet 64, through the Dry Ice bath 74, where any unreacted silicon tetrabromide is frozen out, and through the acid absorption tube 75 where any remaining hydrogen bromide and silicon tetrabromide is absorbed. The exhausted hydrogen is then burned at an open flame at the hydrogen outlet 78.

The silicon crystal will continue to grow as the deposition run proceeds. A rate of growth of the order of 0.125 gram per hour occurs under the conditions stated hereinbefore. After the deposition has proceeded for the desired length of time or until the crystal has reached the desired size, the apparatus is shut down and the silicon crystal is removed from the reaction chamber.

Thus, a single silicon crystal having a high degree of crystalline perfection and purity is produced by the method of the present invention.

Although the present invention has been described in detail in connection with the production of an intrinsic silicon crystal of high purity, the apparatus shown may be used to produce P or N type silicon crystals or silicon crystals having alternate P and N type regions, by intentionally introducing a donor impurity to create an N-type region or an acceptor impurity to create a P-type region. In the presently preferred embodiment, boron tribromide is utilized as the source of acceptor impurity, while phosphorus tribromide is used as the source of donor impurity. Thermodynamic calculations for the deposition of acceptor impurities from the halides of boron, aluminum, gallium, and indium, and donor impurities from the halides of phosphorus, arsenic, and antimony show that any trihalide of the acceptor or donor impurities may be used for doping purposes so far as the thermodynamics of the doping reaction are concerned, and that any such halides will be as strongly decomposed as the silicon tetrabromide. However, a doping halide with a halogen other than bromine tends to be relatively much more strongly decomposed than a bromide of the same element, due to the highly favorable effects of the entropy of mixing of the hydrogen halide in the hydrogen bromide produced from the silicon tetrabromide by the deposition reaction.

If the halide compound of an active impurity such as, for example, boron tribromide, is present as a vapor mixture of boron tribromide and hydrogen in the stream of silicon tetrabromide-hydrogen flowing past the hot silicon filament, the boron tribromide will be decomposed at the temperature and under the conditions stated hereinbefore which are used for the decomposition and deposition of silicon from silicon tetrabromide, to yield boron and hydrogen bromide. The boron then deposits with the free silicon upon the hot silicon filament to form a region of P-type silicon. Similarly, phosphorus tribromide, for example, when introduced into the stream of silicon tetrabromide-hydrogen vapor will decompose and deposit phosphorus as a donor impurity to form an N-type region.

Although various methods may be used to introduce the impurity halide into the flow stream of the silicon tetrabromide-hydrogen mixture, the impurity halide is introduced in this embodiment by introducing the impurity halide in gaseous form in the flow stream above the stripping condenser 46. Thus, referring to the figure, in order to produce a silicon crystal having a large area P-N junction, an N-type silicon seed crystal is prepared and mounted in the reaction chamber 50, as described hereinbefore. A pot 90 containing a quantity of donor impurity halide such as boron tribromide is positioned on a heating mantle 91, the temperature of which is controlled by a Variac. With the apparatus operating as described hereinbefore to deposit pure silicon on the silicon filament, the boron tribromide is raised to a temperature above the boiling point of boron tribromide which is 91° C., by means of the heating mantle 91. The outlet from the pot 90 is connected through an orifice valve 93 to the purified hydrogen line 39 which is connected to the vapor inlet of the reaction chamber 50. Thus, with silicon tetrabromide-hydrogen vapor entering the reaction chamber 50, the valve 93 is opened and boron tribromide vapor is admitted to the reaction chamber 50. The amount of boron tribromide entering the reaction chamber may be controlled by varying the temperature of the liquid boron tribromide in the pot 90 which, in turn, varies the vapor pressure of the boron tribromide gas and by diverting part of the hydrogen flow (not shown) though the boron-tribromide pot to control the flow of the boron-tribromide vapor.

The boron tribromide-hydrogen mixture, like the silicon tetrabromide, is decomposed at the surface of the hot silicon filament, as described hereinbefore, to deposit free boron in addition to the free silicon being deposited, and a P-type region is formed upon the N-type silicon seed crystal. The quantity of boron tribromide vapor entering the reaction chamber may be varied to deposit a quantity of boron in the range of one part boron to between 10,000 to 10 million parts of silicon being deposited, depending upon the resistivity of the region which is desired. The amount of boron to be deposited and the corresponding amount of boron tribromide vapor to be admitted may be easily determined by one skilled in the art.

In like manner, an N-type region may be formed by passing phosphorus tribromide-hydrogen vapor past the hot silicon filament in the silicon tetrabromide hydrogen stream. In order, therefore, to form an N-type region upon the P-type region phosphorus tribromide in liquid form may be substituted for the boron tribromide by removing the pot 90 of boron tribromide and substituting therefor a similar pot of phosphorus tribromide and repeating the procedure described hereinbefore after a thorough flushing of the apparatus with purified hydrogen. For continuous operation a pot of phosphorus tribromide may be mounted in parallel with the pot of boron tribromide in order that alternate regions of P and N type silicon may be formed by alternately releasing boron tribromide vapor and phosphorus tribromide into the hydrogen stream entering the reaction chamber 50.

It will be apparent from the foregoing that impurity halides may also be introduced into the silicon tetrabromide-hydrogen flow stream by mixing a quantity of the impurity halide in liquid form with the silicon tetrabromide in the pot 43. In order to produce alternate regions of opposite conductivity type, two pots, one of which contains silicon tetrabromide and a P-type impurity, and the other of which contains siilcon-tetrabromide and an N-type impurity, may be used alternately. It has been found advantageous therefore in the formation of alternate P and N regions upon the silicon seed crystal to employ a source of impurity halide which is introduced in gaseous form as described hereinbefore.

Thus, the present invention provides a method for forming single silicon crystals of high purity having a high degree of crystalline perfection by deposition of elemental silicon from the vapor phase. In addition, the method of the present invention may be used to produce single silicon crystal bodies having accurately controllable and clearly-defined N and P type silicon regions therein which provide a plurality of P-N junctions in the semiconductor body. The N and P type regions can be produced with any impurity concentrations and concentration gradients desired within very wide limits. By the gas-phase pyrolytic method described herein different types of geometry of semi-finished and finished semiconductor devices are possible. Since a multiplicity of P and N type regions may be formed in a crystal body, these may be exposed in various geometries by partial slicing and suitable lapping to a controlled depth to create semiconductor devices having a plurality of rectifying junctions therein.

What is claimed is:

1. The method of forming a silicon crystal body comprising: suspending a silicon crystal filament in a reaction chamber, suspending a metallic filament in said reaction chamber, passing a vapor mixture of silicon tetrabromide and hydrogen through said reaction chamber, heating said silicon crystal filament and said metallic filament to a predetermined temperature sufficient to cause the decomposition of the silicon tetrabromide, whereby silicon is deposited upon the surfaces of said silicon crystal filament and said metallic filament.

2. The method of growing a crystallographically oriented silicon crystal body comprising: suspending a crystallographically oriented silicon crystal filament in a reaction chamber, suspending a tantalum filament in said reaction chamber, passing a vapor mixture of silicon tetrabromide and hydrogen through said reaction chamber, and heating said silicon filament and said tantalum filament to a temperature in the range of the order of 1100° C. to 1350° C., whereby the silicon tetrabromide is decomposed and silicon is deposited upon the surface of the silicon crystal filament in oriented crystallographic growth and upon said tantalum filament.

3. The method of forming a silicon crystal body having at least one P-N junction therein comprising: suspending a crystallographically oriented silicon filament of a first conductivity type in a reaction chamber, suspending a metallic filament in said reaction chamber, passing a vapor mixture of silicon tetrabromide, hydrogen, and an active impurity halide through said reaction chamber; and heating said silicon filament and said metallic filament to a temperature in the range of the order of 1100° C. to 1350° C., whereby said silicon tetrabromide and said active impurity halide are decomposed at said filament to deposit silicon and said active impurity on the surface of said silicon crystal filament in a crystallographically oriented growth to form a silicon region of a second conductivity type, said deposited region being of a conductivity type opposite that of said silicon filament.

4. The method of forming a P-type silicon region upon an N-type silicon crystal body comprising: suspending a crystallographically oriented silicon filament in a reaction chamber, suspending a tantalum filament in said reaction chamber, said silicon filament being an N-type silicon crystal; passing a vapor mixture of silicon tetrabromide, hydrogen, and boron tribromide through said reaction chamber; and heating said silicon filament and said tantalum filament to a temperature in the range of the order of 1100° C. to 1350° C., whereby said silicon tetrabromide and said boron tribromide are decomposed at said filament to deposit silicon and boron upon said silicon crystal filament in a crystallographically oriented growth to form a P-type silicon region.

5. The method of forming an N-type silicon region upon a P-type silicon crystal body comprising: suspending a crystallographically oriented silicon filament in a reaction chamber, suspending a tantalum filament in said reaction chamber, said silicon filament being a P-type silicon crystal; passing a vapor mixture of silicon tetrabromide, hydrogen, and phosphorus tribromide through said reaction chamber; and heating said silicon filament and said tantalum filament to a temperature in the range of the order of 1100° C. to 1350° C., whereby said silicon tetrabromide and said phosphorus tribromide are decomposed at said filament to deposit silicon and phosphorus upon said silicon crystal filament in a crystallographically oriented growth to form a P-type silicon region.

6. The method of forming a silicon crystal body having alternate N and P type conductivity regions comprising: suspending a crystallographically oriented silicon filament in a reaction chamber; suspending a metallic filament in said reaction chamber, passing a vapor mixture of silicon tetrabromide, hydrogen, and the halide of a first active impurity through said reaction chamber, said first active impurity halide being the halide of an active impurity of the donor type; heating said silicon filament and said metallic filament to a temperature in the range of the order of 1100° C. to 1350° C., whereby said silicon tetrabromide and said first active impurity halide are decomposed at said filament to deposit silicon and said donor impurity on said silicon crystal filament in a crystallographically oriented growth to form an N-type silicon region; removing said first vapor mixture from said reaction chamber; passing a vapor mixture of silicon tetrabromide, hydrogen, and a second active impurity halide through said reaction chamber, said second active impurity halide being the halide vapor of an acceptor impurity; and maintaining said silicon crystal filament at said elevated temperature, whereby said silicon tetrabromide and said second active impurity halide are decomposed at said filament to deposit silicon and said acceptor impurity to form a P-type region upon said N-type region which has been formed upon said silicon filament.

7. The method of forming a silicon crystal body comprising: bringing a vapor mixture of a silicon halide and hydrogen into the vicinity of a silicon crystal filament and a metallic filament, and passing an electric current through said silicon filament and said metallic filament whereby said filaments are heated to a predetermined temperature sufficient to cause the decomposition of said silicon halide at said filament to thereby deposit silicon on said heated silicon crystal filament.

References Cited in the file of this patent

UNITED STATES PATENTS

| | | |
|---|---|---|
| 1,601,931 | Van Arkel | Oct. 5, 1926 |
| 1,617,161 | Koref et al. | Feb. 8, 1927 |
| 2,307,005 | Ruben | Dec. 29, 1942 |
| 2,441,603 | Storks et al. | May 18, 1948 |
| 2,566,711 | Teal | June 12 1951 |
| 2,692,839 | Christensen et al. | Oct. 26, 1954 |
| 2,701,216 | Seiler | Feb. 1, 1955 |
| 2,763,581 | Freedman | Sept. 18, 1956 |